(12) United States Patent
Kawamata

(10) Patent No.: US 6,684,355 B2
(45) Date of Patent: Jan. 27, 2004

(54) MEMORY TESTING APPARATUS AND METHOD

(75) Inventor: Yosuke Kawamata, Tokyo (JP)

(73) Assignees: NEC Corporation, Tokyo (JP); NEC Electronic Corporation, Kanagawa (JP)

( * ) Notice: Subject to any disclaimer, the term of this patent is extended or adjusted under 35 U.S.C. 154(b) by 439 days.

(21) Appl. No.: 09/844,357

(22) Filed: Apr. 27, 2001

(65) Prior Publication Data

US 2001/0042231 A1 Nov. 15, 2001

(30) Foreign Application Priority Data

Apr. 27, 2000 (JP) ........................................ 2000-128430

(51) Int. Cl.$^7$ .............................................. G11C 29/00
(52) U.S. Cl. ...................................... 714/719; 714/710
(58) Field of Search ................................ 714/719, 718, 714/710, 711

(56) References Cited

U.S. PATENT DOCUMENTS

| | | | |
|---|---|---|---|
| 4,586,178 A | | 4/1986 | Bosse |
| 4,876,685 A | * | 10/1989 | Rich |
| 5,247,481 A | | 9/1993 | Conan |
| 5,841,709 A | | 11/1998 | McClure |
| 5,856,985 A | * | 1/1999 | Fujisaki |
| 5,974,579 A | * | 10/1999 | Lepejian et al. |
| 6,374,378 B1 | * | 4/2002 | Takano et al. |
| 6,516,430 B1 | * | 2/2003 | Ogura et al. |

OTHER PUBLICATIONS

UK Patent Office Search Report dated Jan. 14, 2002.

* cited by examiner

Primary Examiner—Phung M. Chung
(74) Attorney, Agent, or Firm—Dickstein, Shapiro, Morin & Oshinsky, LLP.

(57) ABSTRACT

There is provided a memory testing apparatus and a memory testing method, for testing a semiconductor memory having redundant cells. In addition to a plurality of main cell fail information memories for a main cell array in the semiconductor memory under test, one redundant cell fail information memory is provided for redundant cells in the semiconductor memory under test. An address synthesizing circuit receives respective comparison results outputted in parallel from a plurality of comparators, each of which compares an output signal outputted from a semiconductor memory under test with an expected value, and an address supplied to the semiconductor memory under test, and for synthesizing a redundant cell fail information memory address for the redundant cell fail information memory. When at least one of the comparison results outputted in parallel from the plurality of comparators indicates a "fail", a control circuit writes fail information into the redundant cell fail information memory at the redundant cell fail information memory address thus synthesized, with the result that fail information represented by a plurality of fail information bits outputted from the plurality of comparators is written into one cell within the fail information memory with one writing access.

14 Claims, 9 Drawing Sheets

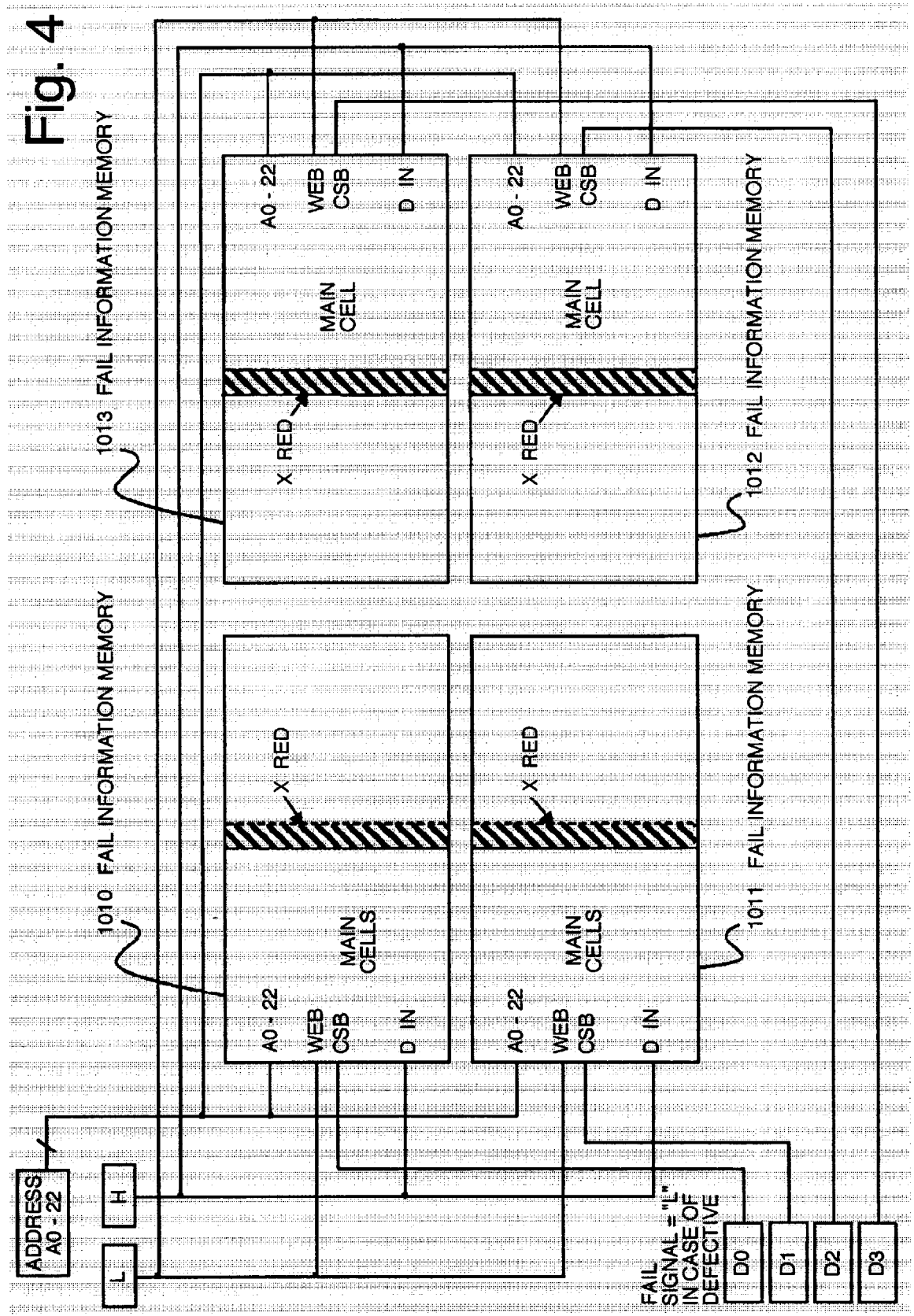

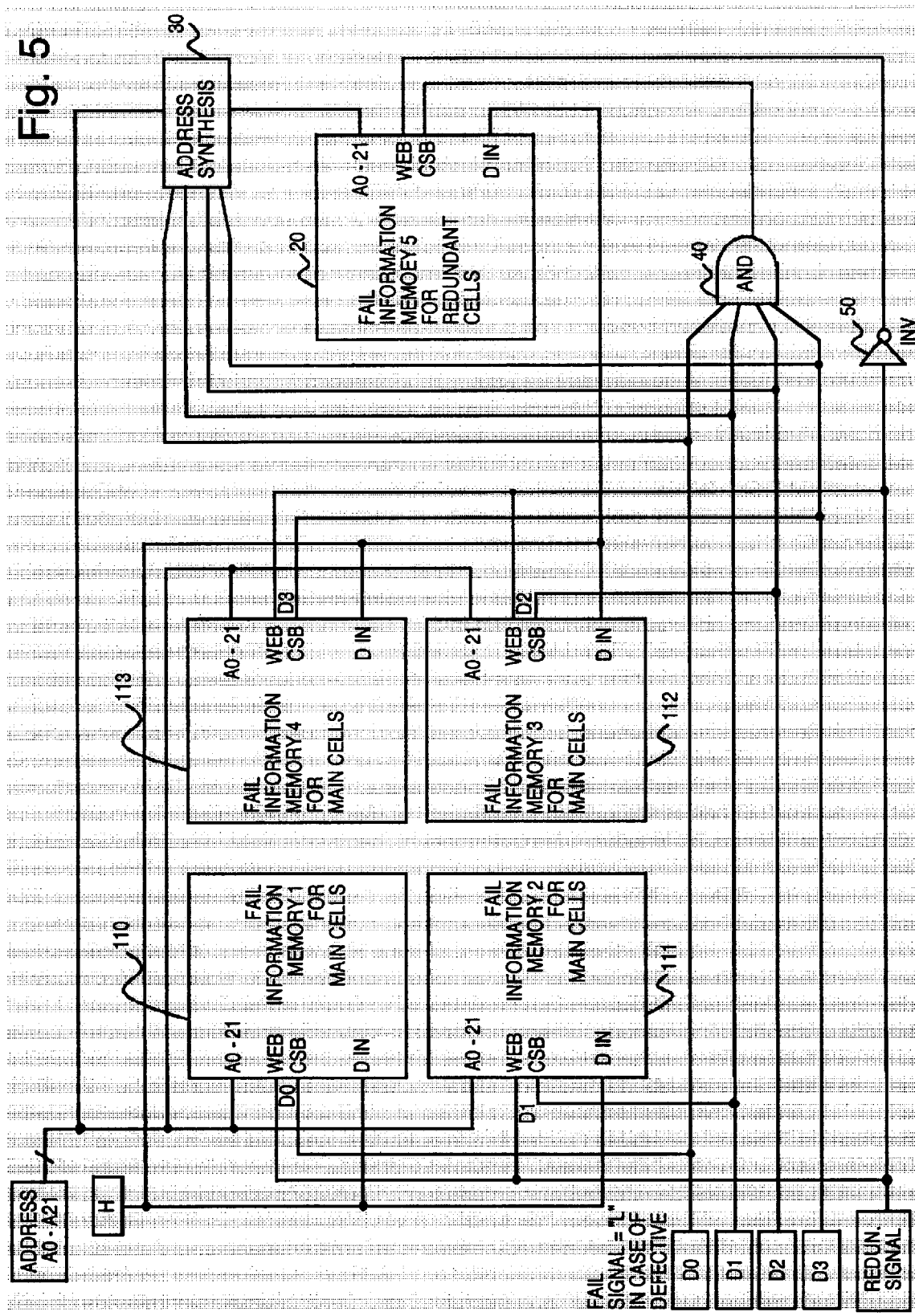

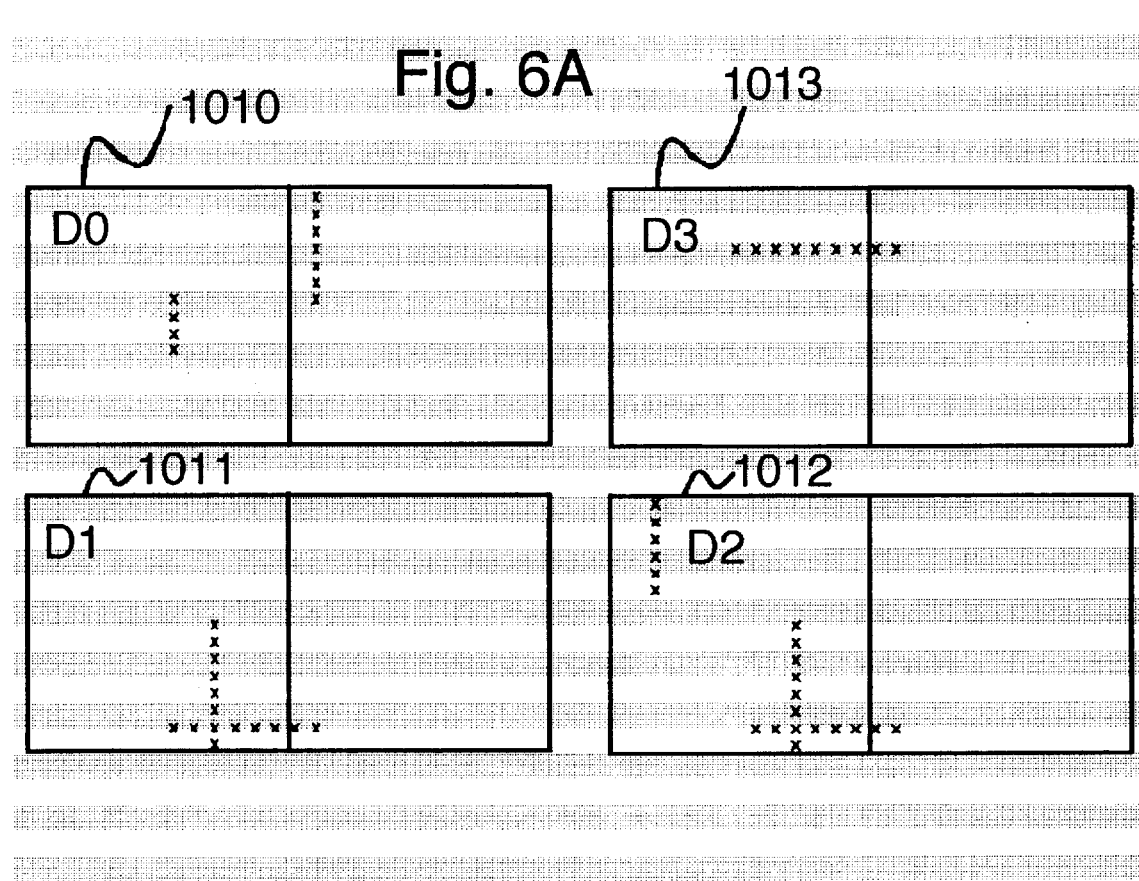
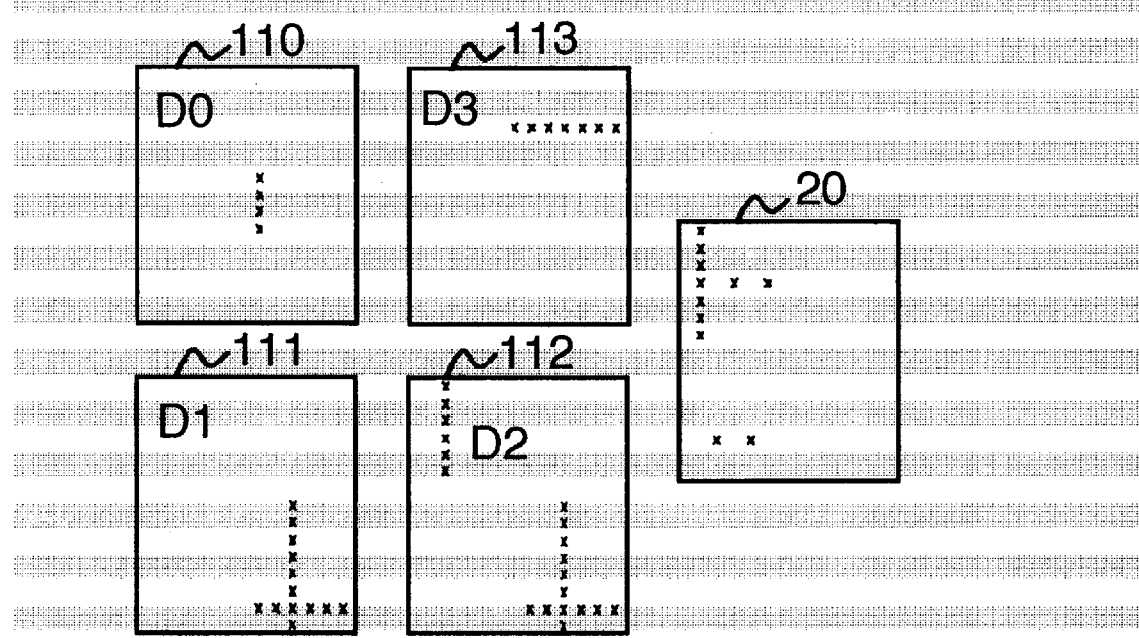

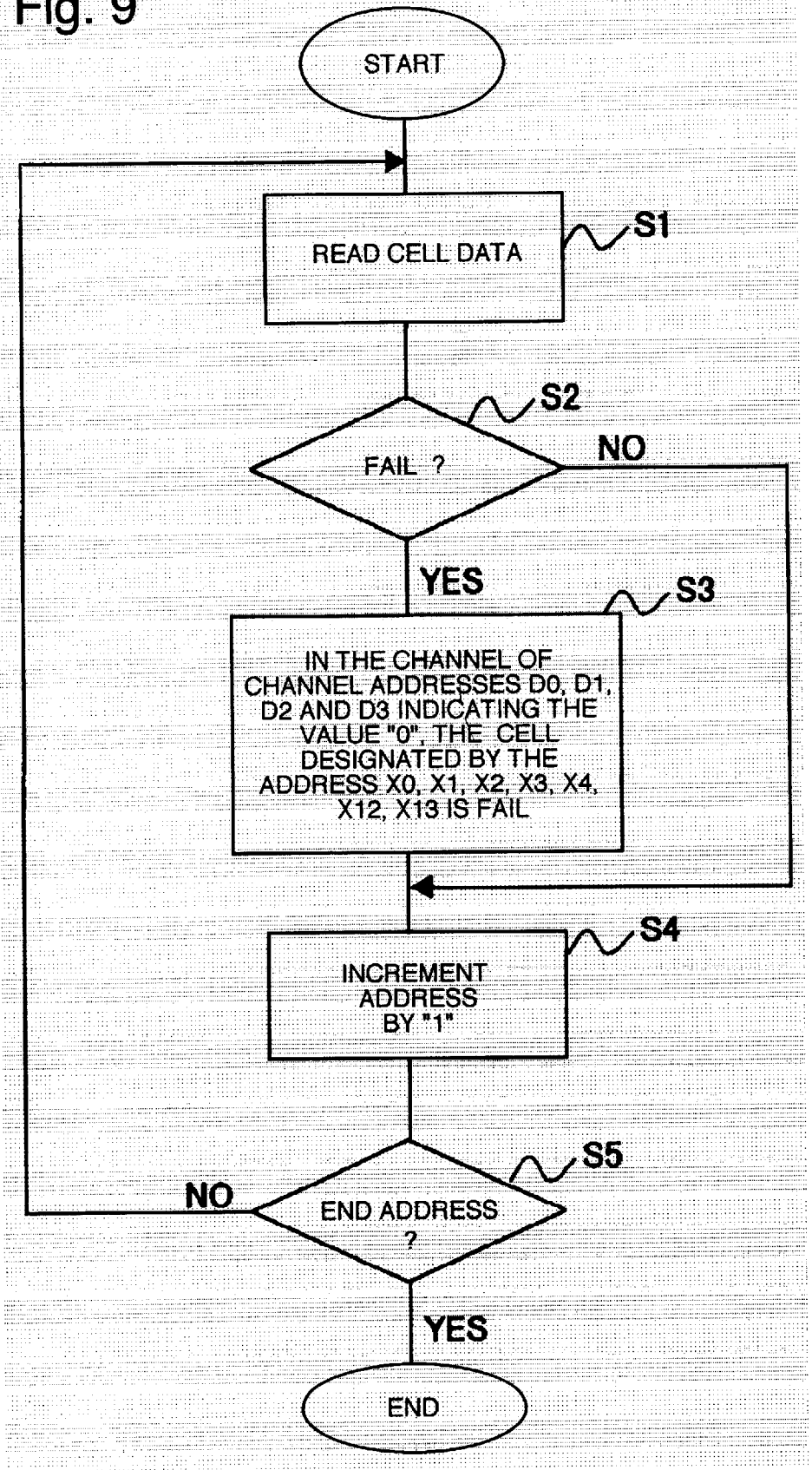

MEMORY TESTING APPARATUS AND METHOD

BACKGROUND OF THE INVENTION

The present invention relates to a memory testing apparatus and a memory testing method, and more specifically to the structure of a fail information memory in a memory testing apparatus and a memory testing method using a fail information memory.

In the prior art, a redundant design is adopted in a semiconductor memory in order to remedy the whole of a memory device from becoming defective because of one bit memory cell defect or one row or column defect.

Referring to FIG. 1, there is shown a block diagram of an example of a conventional memory of the redundant design. The shown memory is so configured that when a defective row or column within a memory cell array 200 of the semiconductor memory is accessed, a redundant row 203 or a redundant column 204 is selected in place of the defective row or column by a redundant X decoder 205 or a redundant Y decoder 206, with the result that since the memory cell array 200 containing the defective row or column is remedied, the yield of production is elevated.

Explaining the semiconductor memory shown in FIG. 1, in the memory cell array 200 there is accessed a memory cell designated by a word line selected by an X decoder 201, which receives and decodes an X address and selects a word line designated by the X address, and a digit line selected by a Y decoder 202, which receives and decodes a Y address and selects a digit line designated by the Y address, by turning on a not-shown Y switch connected in series in the digit line designated by the Y address. In this access, if the memory cell designated within the memory cell array 200 is defective, the access to the designated memory cell is replaced by an access to a redundant cell included in the redundant row 203 or the redundant column 204, by action of the redundant X decoder 205 or the redundant Y decoder 206. Here, in order to distinguish the memory cells included in the memory cell array 200 from the redundant cells, each memory cell included in the memory cell array 200 will be called a "main cell", and the memory cell array 200 will be called a "memory cell array" in this specification.

When a defective cell is detected at a wafer test in a semiconductor memory fabricating process, the redundant row or the redundant column is set by cutting off a fuse in a circuit provided in the semiconductor memory of the redundant design. Here, replacement of the defective cell by the redundant cell in the semiconductor memory of the redundant design is ordinarily executed by various methods, for example, the cutting-off of the fuse, a laser annealing diffusion, an EEPROM, a metal fuse, etc. However, since this does not have a direct relation to the subject of the present invention, further explanation will be omitted.

A memory tester used for detecting a defective in the semiconductor memory at the wafer test or at a final test after the semiconductor memory is assembled, includes a fail information memory for storing fail information.

In the wafer test, the fail information stored in the fail information memory of the memory tester is read out from the fail information memory, and is stored as a fail bit map information in a host computer of the memory tester. After the wafer test, in the semiconductor memory of the redundant design, the redundant row or the redundant column is set on the basis of the fail bit map by the fuse cutting-off or another means.

Referring to FIG. 2, there is shown a functional block diagram illustrating the construction of one example of a conventional memory tester. As shown in FIG. 2, the conventional memory tester includes a timing generator (TG) 100 for generating various timings including a timing of a test cycle, an edge timing of an applied waveform, a strobe timing of a comparator, and others, an algorithmic pattern generator (ALPG) 102 for generating various address patterns and data including a march, a galloping, and others, a programmable data selector (PDS) 103 for allocating a pattern supplied from the algorithmic pattern generator (ALPG) 102 to arbitrary pins on the basis of a test program, a formatter (FC) 104 for variably controlling the format of a waveform to be applied, a driver circuit 105 for applying an input pattern to input terminals of a device under test (DUT) 108, a comparator circuit 106 for receiving and comparing output signals from the device under test (DUT) 108, a digital comparator (DC) 107 for comparing the comparison result outputted from the comparator circuit 106 with a desired value pattern, and a fail information memory 101 receiving the comparison result outputted from the digital comparator (DC) 107 for storing the fail information for each test cycle and in accordance with a test address.

Referring to FIG. 3, there is shown a block diagram showing the construction of one channel of a comparison function in the conventional memory tester shown in FIG. 2, although the comparison function actually includes a plurality of channels. In FIG. 8, a voltage outputting circuit (VO) 109 generates a reference voltage to be compared with the output signal of the device under test (DUT), specifically, a high level reference voltage and a low level reference voltage. The comparator 106 compares the output signal of the device under test (DUT), with the reference voltages supplied from the voltage outputting circuit (VO) 109, and outputs the result of the comparison to the digital comparator (DC) 107. The digital comparator (DC) 107 is controlled by the strobe signal supplied from the timing generator (TG) 100 to compare the comparison result outputted from the comparator 106 with an expect value data generated in the algorithmic pattern generator (ALPG) 102 and pin-allocated by the programmable data selector (PDS) 103.

As shown in FIG. 3, the fail information memory 101 is provided for each comparator channel, and when the result of the comparison executed in the digital comparator (DC) 107 shows a "fail", the fail information is written into the fail information memory 101 in accordance with the address outputted from the algorithmic pattern generator (ALPG) 102, namely, the reading address for the device under test when the "fail" occurs.

However, a specific proposal and development have not yet been made in connection with the architecture of a memory tester having a fail information memory corresponding to the redundant cells in the semiconductor memory of the redundant design.

Here, consideration will be made on the case that the semiconductor memory of the redundant design is tested by use of the conventional memory tester mentioned above. In this case, the redundant cells in the semiconductor memory of the redundant design are tested (for example, after data is written to the redundant cells, data is read out from the redundant cells). If fail information of the redundant cells is written to a fail information memory, it is inevitably necessary to increase the memory capacity of the fail information memory. This is disadvantageous.

Now, this problem will be described in detail on the assumption that the fail information of the redundant cells in the device under test is written to a fail information memory of the existing memory tester.

Here, in the wafer test, an address space of the semiconductor memory of the redundant design, which is accessed by the memory tester by setting the semiconductor memory of the redundant design to a test mode, is composed of a combination of an address space of the main cell array and an address space of the redundant cell array. On the other hand, after shipment of a semiconductor memory product, since replacement of defective cells in the main cell array by redundant cells has been finished within the inside of the semiconductor memory, the address space of the semiconductor memory accessible to a user corresponds to the main cell array.

When the semiconductor memory of the redundant design shown in FIG. 1 is tested by use of the conventional memory tester shown in FIGS. 2 and 3, it may be considered that the fail information memory 101 has an arrangement as shown in for example FIG. 4. The fail information memory shown in FIG. 4 corresponds to the fail information memory 101 shown in FIG. 3, but is so configured to receive the comparison results (channel data bits D0 to D3) outputted from respective digital comparators of a plurality of comparator channels. Here, it is to be noted that FIG. 4 shows an imaginary arrangement that the inventor derived from the prior art shown in FIGS. 1 to 3. Therefore, the example shown in FIG. 4 will be called an "imaginary prior art example" in this specification.

Referring to FIG. 4, the fail information memory 101 includes a plurality of fail information memories 1010 to 1013 corresponding to respective channels "0" to "3" of a plurality of comparator channels (four channels in the example shown in FIG. 4).

In the imaginary prior art example shown in FIG. 4, the channel data bit D0 is the comparison result outputted from the digital comparator (107 in FIG. 2) for the comparator channel "0", and the channel data bits D1, D2 and D3 are the comparison result outputted from the digital comparators for the comparator channels "1", "2" and "3", respectively. These channel data bits D0 to D3 are outputted in parallel to one another from the respective digital comparators for the comparator channels "0" to "3" at the same timing defined by the strobe signal (programmed at a predetermined timing in a test cycle).

The channel data bit D0 is brought to a low level when the comparison result outputted from the digital comparator shows a "fail", and to a high level when the comparison result outputted from the digital comparator shows a "pass". This channel data bit D0 is inputted to a chip select terminal CSB (where the tail end character "B" indicates a low active signal) of the fail information memory 1010. When the channel data bit D0 indicates the "fail" (the low level), the chip select terminal CSB of the fail information memory 1010 is activated, and therefore, a high level signal supplied to a data input terminal D IN of the fail information memory 1010 is written to a cell within the fail information memory 1010 selected by the address when the "fail" occurs (namely, the addresses A0 to A22 supplied from the algorithmic pattern generator (ALPG) 102). Here, in the imaginary prior art example shown in FIG. 4, a write enable terminal WEB (where the tail end character "B" indicates a low active signal) of the fail information memory 1010 is fixed to a low level, so that the fail information memory 1010 is maintained in a write enable condition.

On the other hand, when the channel data bit D0 indicates the "pass" (the high level), the chip select terminal CSB of the fail information memory 1010 is inactivated so that none is written into the fail information memory 1010.

The above explanation will be applied similarly to the fail information memories 1011 to 1013 for the other channel data bit D1 to D3.

Here, the arrangement of the above mentioned fail information memory is considered. In order to test, as a simple example, the semiconductor memory of the redundant design which comprises the main cell array (200 in FIG. 1) having 1024 rows (1K) and 1024 columns (1K) and therefore having a memory capacity of 1 Mbits and four redundant rows (203 in FIG. 1) added to the main cell array, it is necessary to add a memory capacity of 4×1K cells for the redundant rows to the fail information memory having the memory capacity of 1 Mbits for the main cell array. In FIG. 4, the hatched portion X RED indicates a fail information memory portion for the redundant rows.

In other words, as an address space of the fail information memory, the X address is changed from 10 bits of the fail information memory for the main cell array to 11 bits. This means that, as shown in FIG. 4, it is necessary to add, as a fail information memory for the redundant rows, a fail information memory having the same memory capacity as that of the fail information memory for the main cell array, to the fail information memory for the main cell array. As a result, two times the memory capacity of the conventional fail information memory is required for the fail information memory for the main cell array of the semiconductor memory of the device under test (a conventional fail information memory) and the fail information memory for the redundant rows.

Furthermore, if not only the redundant rows but also the redundant columns are tested and the fail information of all the redundant cells are stored in the fail information memory, it is necessary to prepare a fail information memory having four times the memory capacity required for the test of the main cell array.

Accordingly, for each of the channel data bits D0 to D3, it is necessary to prepare the fail information memory having four times the memory capacity of the conventional fail information memory. As a result, the memory capacity of the fail information memory provided in the memory tester becomes large.

BRIEF SUMMARY OF THE INVENTION

Accordingly, it is an object of the present invention to provide a memory testing apparatus and a memory testing method which have overcome the above mentioned problems.

Another object of the present invention is to provide a memory testing apparatus and a memory testing method, capable of reducing the memory capacitor of the fail information memory required for testing the redundant cells in the semiconductor memory of the redundant design.

Still another object of the present invention is to provide a memory testing apparatus and a memory testing method, capable of reducing the memory capacitor of the fail information memory required for testing the redundant cells in the semiconductor memory of the redundant design, and also capable of speeding up a writing of fail information of the redundant cells into the fail information memory.

The above and other objects of the present invention are achieved in accordance with the present invention by a memory testing apparatus for testing a semiconductor memory, comprising:

means receiving respective comparison results outputted from a plurality of comparators, each of which compares an output signal outputted from a semiconductor memory under test with an expected value, and an address supplied to the semiconductor memory under test, and for synthesizing an address for a fail information memory; and means for writing fail information into the fail information memory at the address synthesized, when at least one of the comparison results outputted from the plurality of comparators indicates a "fail", whereby a corresponding number of fail information outputted from the plurality of comparators is written into one cell within the fail information memory.

Specifically, the memory testing apparatus comprises:

a plurality of main cell fail information memories for a main cell array in a semiconductor memory under test, the plurality of fail information memories being provided for a corresponding number of comparator channels, respectively; and one redundant cell fail information memory provided for redundant cells in the semiconductor memory under test, one for the plurality of main cell fail information memories, so that a test result of the redundant cells in the semiconductor memory under test is written into the redundant cell fail information memory.

According to another aspect of the present invention, there is provided a memory testing method for testing a semiconductor memory having redundant cells in addition to a main cell array, as a device under test, by use of a memory testing apparatus, the memory testing apparatus comprising:

a plurality of main cell fail information memories for the main cell array in the semiconductor memory under test, the plurality of fail information memories being provided for a corresponding number of comparator channels, respectively; and one redundant cell fail information memory provided for the redundant cells in the semiconductor memory under test, one for the plurality of main cell fail information memories, so that a test result of the redundant cells in the semiconductor memory, wherein, when at least one of respective comparison results outputted from a plurality of comparators, each of which compares an output signal outputted from the semiconductor memory under test with an expected value, indicates a "fail", an address is synthesized from the respective comparison results outputted in parallel from the plurality of comparator and an address supplied to the semiconductor memory under test when the "fail" occurs, and fail information is written into the redundant cell fail information memory at the address thus synthesized, so that fail information represented by a plurality of fail information bits outputted in parallel from the plurality of comparators is written into one cell within the fail information memory with one writing access.

The above and other objects, features and advantages of the present invention will be apparent from the following description of preferred embodiments of the invention with reference to the accompanying drawings.

BRIEF DESCRIPTION OF THE DRAWINGS

FIG. 4 is a block diagram illustrating an imaginary arrangement of the fail information memory which may be considered when the semiconductor memory of the redundant design shown in FIG. 1 is tested by use of the conventional memory tester shown in FIGS. 2 and 3;

FIG. 5 is a block diagram illustrating the arrangement of the fail information memory in an embodiment of the memory testing apparatus in accordance with the present invention;

FIGS. 6A and 6B illustrate how the fail information is stored in the fail information memory, in the imaginary arrangement shown in FIG. 4 and in the embodiment of the memory testing apparatus in accordance with the present invention;

FIG. 9 a flow chart illustrating how the fail information is read out from the fail information memory in the embodiment of the memory testing apparatus in accordance with the present invention.

DETAILED DESCRIPTION OF THE INVENTION

Now, a preferred embodiment of the memory testing apparatus in accordance with the present invention will be described with reference to the drawings. Referring to FIG. 5, there is shown a block diagram illustrating the arrangement of the fail information memory in an embodiment of the memory testing apparatus in accordance with the present invention. For a plurality of comparator channels "0" to "3", the embodiment shown in FIG. 5 includes a plurality of fail information memories 110 to 113 for a main cell array, and one fail information memory 20 for the redundant cells.

When the digital comparator (107 in FIG. 3) of each comparator channel compares data read out from the memory cell array of the semiconductor memory DUT with an expected value pattern, and outputs the comparison result indicative of a "fail", fail information is written into a corresponding one of the fail information memories 110 to 113 at an address corresponding to the address of the memory cell which resulted in "fail".

On the other hand, when the redundant cells in the semiconductor memory DUT is tested, if a redundant cell results in "fail", fail information is written into the fail information memory 20 for the redundant cells, at an address synthesized by combining the address of the fail cell (A0-A21) and the comparison results of the plurality of comparator channels "0" to "3" (channel data bits D0 to D3).

With this arrangement, the required memory capacity is reduced to one-fourth of the total memory capacity of the fail information memories required in the imaginary prior art example shown in FIG. 4.

Figure 1:
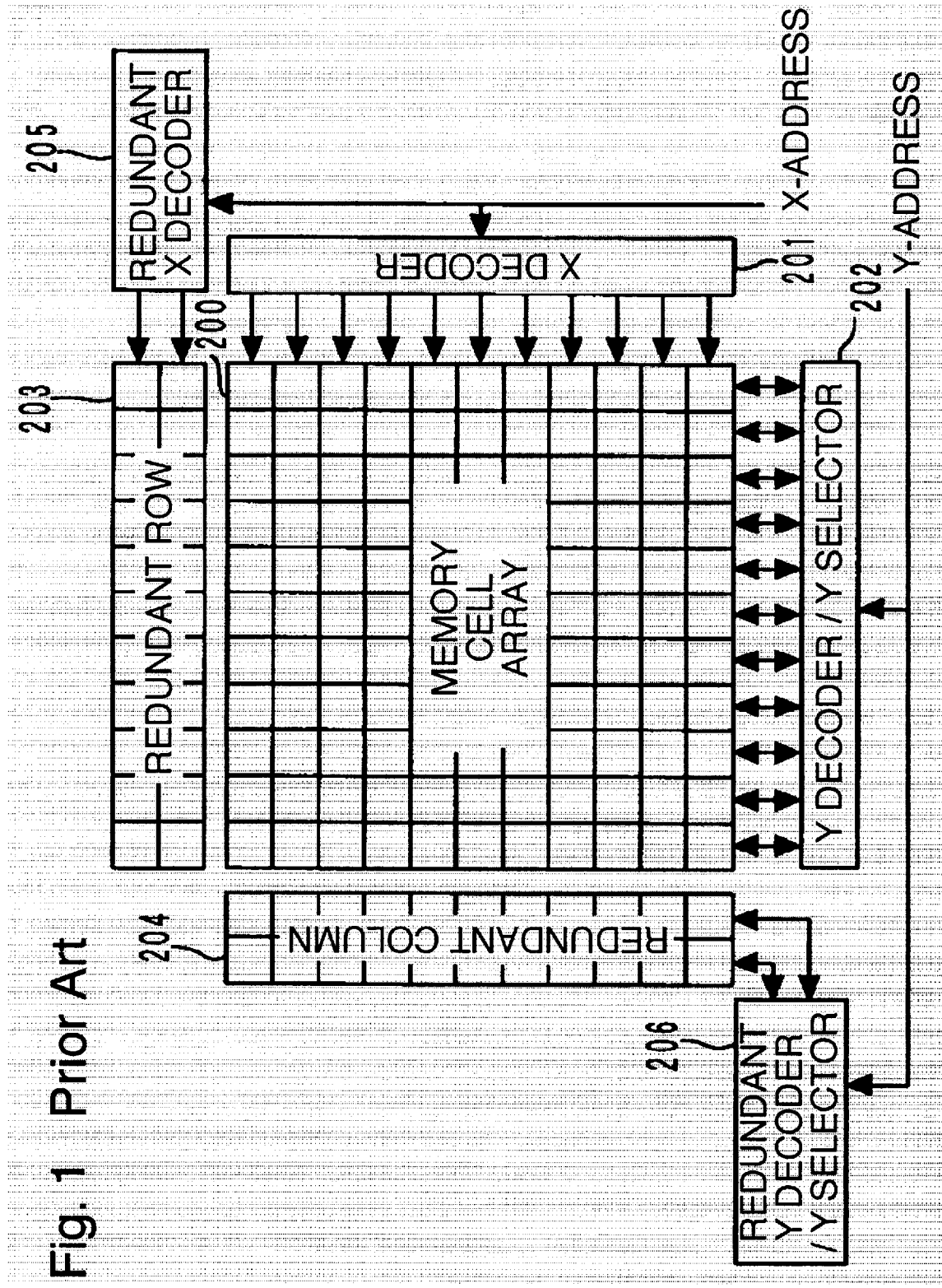
FIG. 1 is a block diagram of an example of a conventional semiconductor memory of the redundant design.
Figure 2:
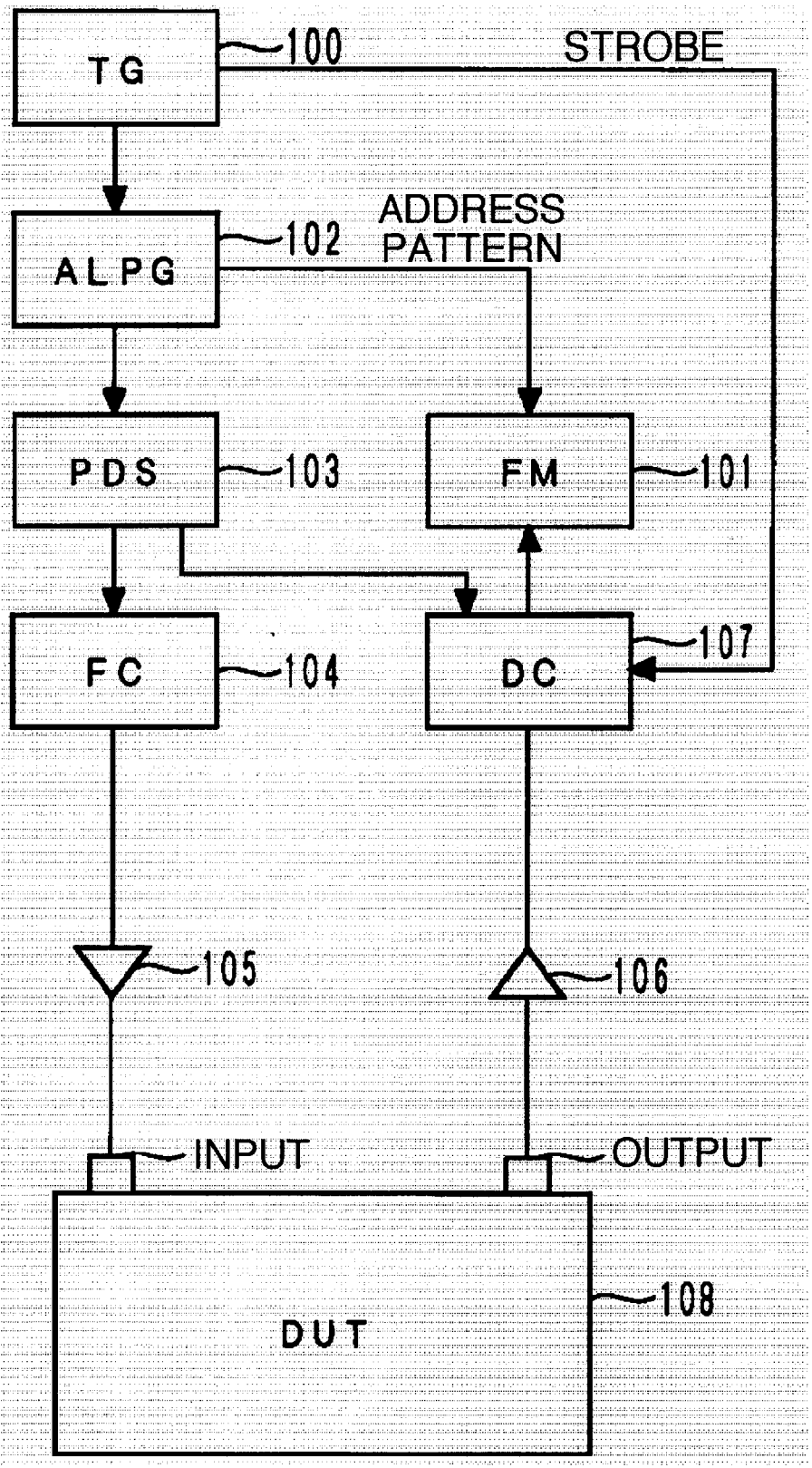
FIG. 2 is a functional block diagram illustrating the construction of one example of a conventional memory tester.

Returning to FIG. 5, the preferred embodiment of the memory testing apparatus in accordance with the present invention will be described in detail. In FIG. 5, only the arrangement of the fail information memories is shown since the basic construction of the memory tester and the construction of each comparator channel are similar to those shown in FIGS. 2 and 3.

Figure 3:
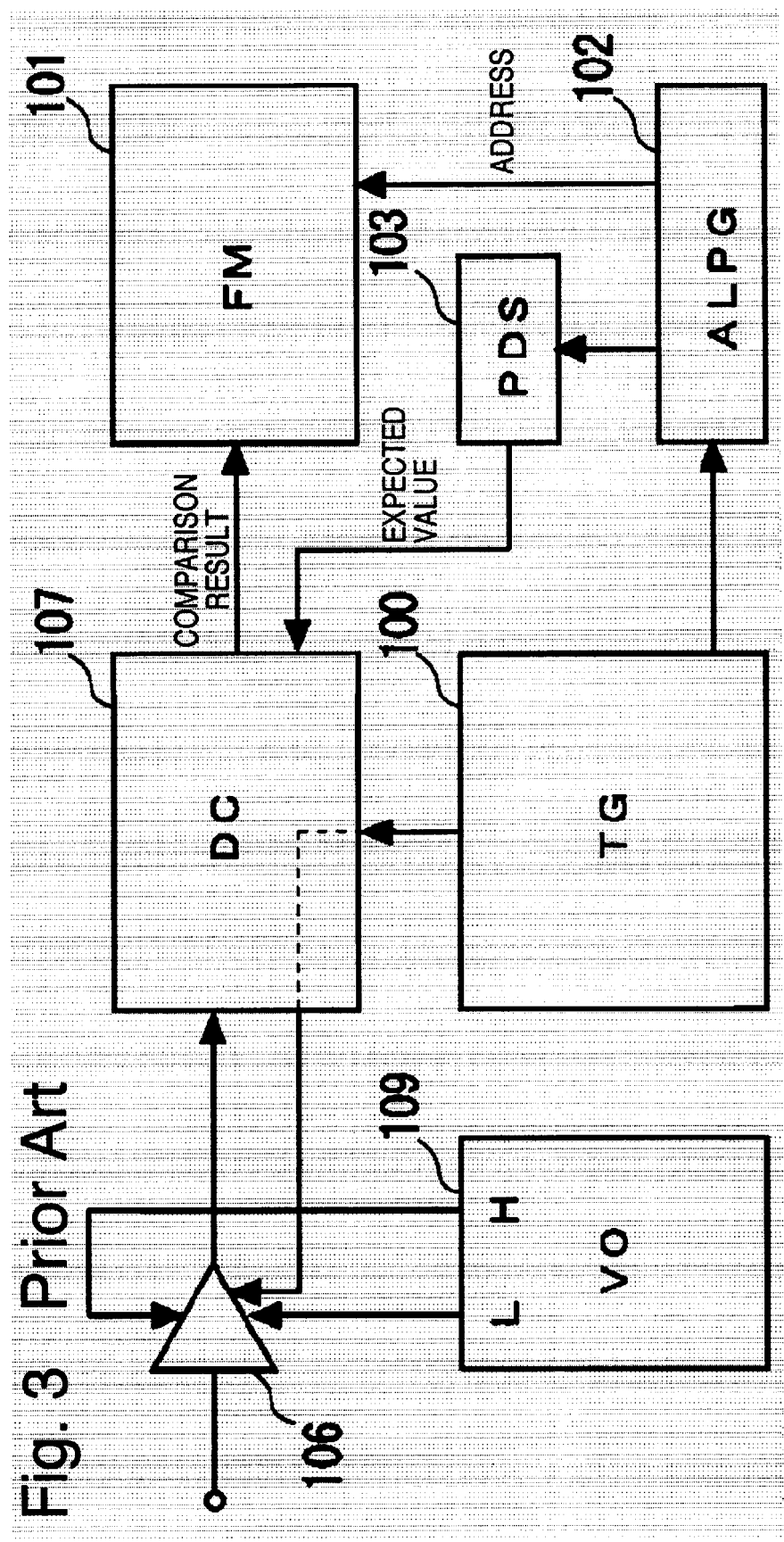
FIG. 3 is a block diagram showing the construction of one channel of a comparison function in the conventional memory tester shown in FIG. 2.

The arrangement composed of the fail information memories shown in FIG. 5 corresponds to the fail information memory (FM) 101 shown in FIG. 3, excepting that FIG. 3 shows the arrangement of one comparator channel but FIG. 5 shows the arrangement of four comparator channels, so that the comparison results of the digital comparators of the four comparator channels are inputted in parallel to each other to the fail information memory arrangement.

The fail signal indicative of the comparison result (one-bit data) outputted from the digital comparator (DC) 107 shown in FIG. 3 for the channel "0" is inputted as the channel data bit D0 shown in FIG. 5. The fail signal becomes a high level when the comparison result is a "pass" and a low level when the comparison result is a "fail".

The fail signal of the channel data bit D0 is supplied to a chip select terminal CSB (where the tail end character "B" indicates a low active signal) of the fail information memory 110. When the channel data bit D0 indicates the "fail" (the low level), the chip select terminal CSB of the fail information memory 110 is activated, a high level signal supplied to a data input terminal D IN of the fail information memory 110 is written to a cell within the fail information memory 110 selected by the address when the "fail" occurs (namely, the addresses A0 to A21 supplied from the algorithmic pattern generator (ALPG) 102. Here, the low level has been written into all cells of the fail information memories 110 to 113 in an initialized condition, as before the test starts.

In the embodiment shown in FIG. 5, the address signals A0 to A21 (22 bits) corresponding to the address space of the main cell array of the semiconductor memory of the device under test are supplied to the fail information memory 110. Therefore, the bit number of the address signals supplied to the fail information memory is smaller than that of the address signals A0 to A22 in the imaginary prior art example shown in FIG. 4, by one bit. As a result, the required memory capacity of the fail information memory can be reduced in comparison with the imaginary prior art example shown in FIG. 4, as will be explained in detail hereinafter.

A redundancy signal is supplied to a write enable terminal WEB (where the tail end character "B" indicates a low active signal) of the fail information memory 110. When this redundancy signal is at a low level, it indicates that the memory cell testing is carried out for the main cell array of the semiconductor memory of the device under test, and the fail information memory 110 is put in a write enable condition. On the other hand, when the redundancy signal is at a high level, it indicates that the memory cell testing is carried out for the redundant cells of the semiconductor memory of the device under test, and the write enable terminal WEB of the fail information memory 110 is inactivated so that the fail information memory 110 is put in a condition unable to write.

The fail information memories 111 to 113 for the other channel data bits D1 to D3 are constructed similarly to the fail information memory 110 for the channel data bit D0.

The redundancy signal is also supplied to an inverter 50, an output of which is connected to a write enable terminal WEB of the fail information memory 20. Therefore, when the redundancy signal is at the high level, the write enable terminal WEB of the fail information memory 20 is brought into the low level, so that the fail information memory 20 is put in a write enable condition. On the other hand, when the redundancy signal is at the low level, the write enable terminal WEB of the fail information memory 20 is inactivated so that the fail information memory 20 is put in a condition unable to write.

Here, the redundancy signal is generated within the inside of the memory tester, by utilizing for example the pattern generated in the algorithmic pattern generator (ALPG) 102 (FIG. 3). In this case, the algorithmic pattern generator (ALPG) 102 is so configured to generate a dummy address bit A22 in addition to the address A0 to A21. This dummy address bit A22 is brought to a high level when the redundant cells of the device under test are tested and to a low level when the main cell array of the device under test is tested. The dummy address bit A22 generated in the algorithmic pattern generator (ALPG) 102 is supplied to an input terminal for the redundancy signal within the inside of the memory tester. However, it is sufficient if the redundancy signal can take a different logic value, dependently upon which of the main cell array of the device under test and the redundant cells of the device under test are tested, and therefore, the method for generating the redundancy signal is in no way limited to only the above mentioned example.

A chip select terminal CSB of the fail information memory 20 for the redundant cells is connected to an output of a four-input AND circuit 40, which receives the fail signals of the four channel data bits D0 to D3. Therefore, when at least one of the fail signals of the four channel data bits D0 to D3 is at the low level indicative of the "fail", the output of the AND circuit 40 is brought to the low level, and therefore, the chip select terminal CSB of the fail information memory 20 is activated so that the fail information memory 20 is selected. At this time, if the redundancy signal is at the high level indicative of the test of the redundant cells, the high level connected to a data input terminal DIN of the fail information memory 20 is written, as fail information, to the fail information memory 20 to an address designated by an address synthesizer 30.

This address synthesizer 30 receives the fail signals of the four channel data bits D0 to D3 and the address A0 to A21 generated by the algorithmic pattern generator (ALPG) 102 (FIG. 3) for synthesizing the address for the fail information memory 20 for the redundant cells.

Now, with reference to FIGS. 6A and 6B, the method for utilizing the fail information memory in the embodiment of the present invention shown in FIG. 5 and in the imaginary prior art example shown in FIG. 4 will be described. FIG. 6A diagrammatically illustrates how the fail information for the redundant cells is stored in the fail information memory in the imaginary prior art example shown in FIG. 4, and FIG. 6B diagrammatically illustrates how the fail information for the redundant cells is stored in the fail information memory in the embodiment of the present invention shown in FIG. 5. In FIG. 6A and FIG. 6B, the mark "x" indicates a cell storing the fail information bit indicative of the "fail".

As seen from comparison between FIG. 6A and FIG. 6B, the embodiment of the present invention in which one fail information memory 20 for the redundant cells is provided in common to four fail information memories 110 to 113 for the main cells, and the fail information for the redundant cell is written into the fail information memory 20 for the redundant cells in accordance with the address synthesized from the plurality of channel data bits D0 to D3, can reduce the required memory capacity of the fail information memory for the redundant cells, to one fourth of the required memory capacity of the fail information memory for the redundant cells in the imaginary prior art example shown in FIG. 4.

Now, the address synthesizer 30 in the embodiment of the present invention will be described with reference to FIG. 7, which illustrates an example in which the semiconductor memory of the device under test has a four-bank construction so that a bank selection is carried out by two bits, and fail information of the redundant cells for the memory cell array of each bank is developed to the address of the fail information memory 20 for the redundant cells. Here, it is assumed that the address for selection of the redundant rows is composed of X0 to X4 (namely, 32 redundant word lines (redundant rows) are provided).

The address synthesizer 30 receives the address signals A0 to A21 and the channel data bits D0 to D3 for the comparator channels "0" to "3", and generates an X address signal (synthesized address signal) of 11 bits, which is composed of four least significant bits ("0"th bit to "3"rd bit) constituted of the channel data bits D0 to D3, "4"th bit to "8"th bit composed of the row address bits X0 to X4 for selection of the redundant row, of the address signal A0 to A21, and "9"th bit and "10"th bit constituted of the bank selection bits X12 and X13 of the address signal A0 to A21.

For example, for the redundant row R1 of the semiconductor memory of the device under test, when the cell designated by the 7 bits composed the address bits X0 to X4 and the bank selection bits X12 and X13 and the Y address (column address) is a "fail", the fail information is written into the address accessed by the channel data bits D0 to D3. In the fail information memory 20 shown in FIG. 7, the axis of abscissas shows the X address, and the axis of ordinates shows the Y address.

Figure 8:
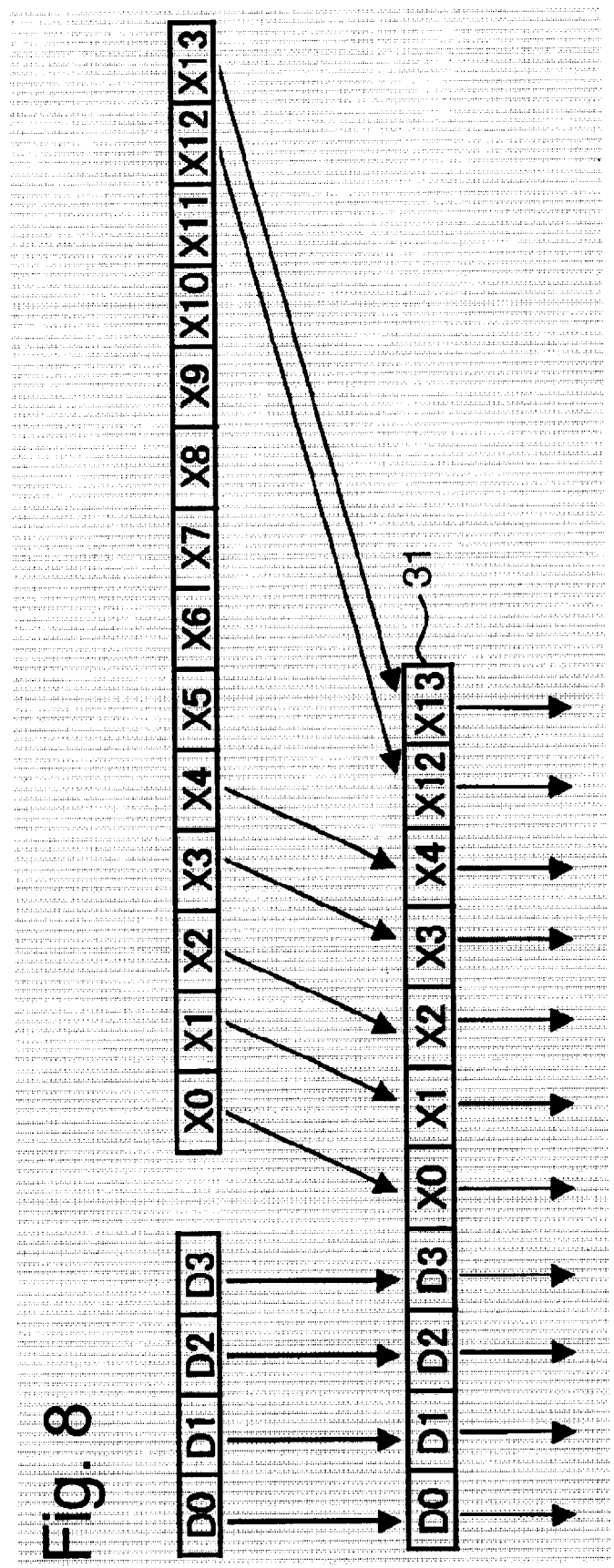
FIG. 8 illustrates how the address is synthesized in the embodiment of the memory testing apparatus in accordance with the present invention.

For generating the X address for the fail information memory 20 for the redundant cells, the address synthesizer 30 includes a 11-bit register 31 as shown in FIG. 8. As mentioned above, the address synthesizer 30 receives the X address of the address generated in the algorithmic pattern generator (ALPG) 102 (FIG. 3) and the input channel data bits D0 to D3. The input channel data bits D0 to D3 are stored in the least significant bit ("0"th bit) to the "3"rd bit of the 11-bit register 31, respectively. The X address bits X0 to X4 are stored in the "4"th bit to the "8"th bit of the 11-bit register 31, respectively. The bank selection bits X12 and X13 are stored in the "9"th bit to the "10"th bit of the 11-bit register 31, respectively. Thus, the X address composed of D0 to D3, X0 to X4 and X12 and X13 is synthesized in the register 31, and outputted to the fail information memory 20 for the redundant cells. The Y address of the memory cell included in the redundant rows is expressed by the Y address of the address signal A0-A21 without modification. For the redundant columns, the address synthesizer 30 generates the Y address of 11 bits for the fail information memory 20 for the redundant cells, similarly to the above mentioned X address of 11 bits for the fail information memory 20 for the redundant cells.

Figure 7:
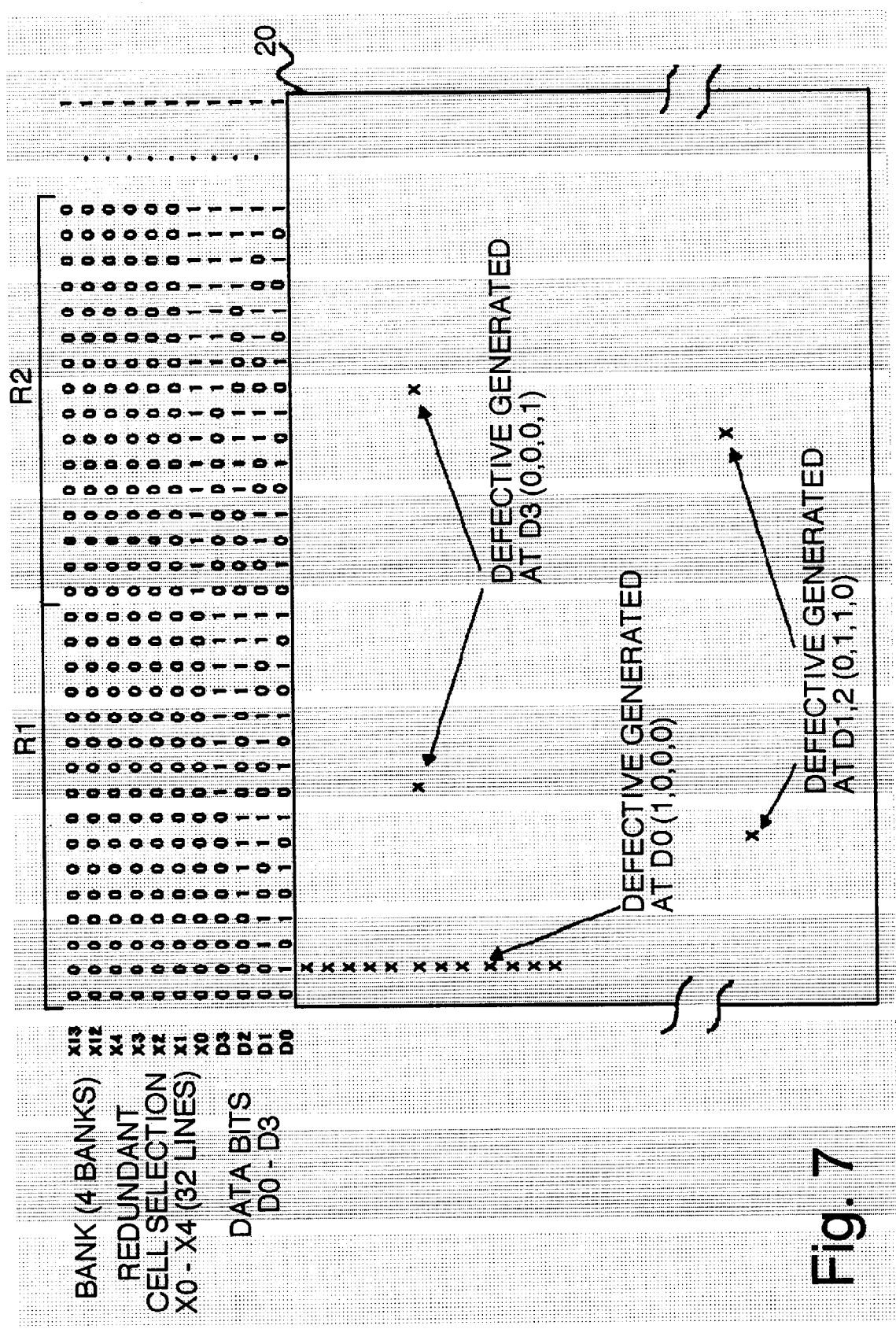
FIG. 7 illustrates in detail how the fail information is stored in the fail information memory in the embodiment of the memory testing apparatus in accordance with the present invention.

As shown in FIG. 7, when at least one of the comparator channel data bits (outputted from the plurality of digital comparators which receives parallels outputs from the device under test) indicates a "fail", the fail information is written into the fail information memory 20 for the redundant cells, at the address (D0 to D3, X0 to X4, X12, X13) synthesized from the comparison result bits D0 to D3 outputted in parallel from the plurality of digital comparators and the address when the "fail" occurs. Thus, a plurality of fail information bits corresponding to a plurality of channel data bits D0 to D3 (the comparison result bits outputted in parallel from the plurality of digital comparators) are written into one cell in the fail information memory 20 for the redundant cells, at one writing access. Therefore, a total writing time for the fail information memory 20 for the redundant cells can be shortened, and on the other hand, the memory capacity can be efficiently utilized. For example, the fail information of one cell (x) designated by D0 (1, 0, 0, 0) in FIG. 7 is the fail information for the redundant row R1 when a plurality of channel data bits D1, D2 and D3 show a "fail" (at the low level). The fail information of one cell (x) designated by D1, 2 (0, 1, 1, 0) in FIG. 7 is the fail information for the redundant row R1 (or R2) when a plurality of channel data bits D0 and D3 show a "fail" (at the low level). The fail information of one cell (x) designated by D3 (0, 0, 0, 1) in FIG. 7 is the fail information for the redundant row R1 (or R2) when a plurality of channel data bits D0, D1 and D2 show a "fail" (at the low level).

The above mentioned embodiment of the present invention so configured to be able to write a plurality of fail information bits corresponding to a plurality of comparator channels "0" to "3", into one cell in the fail information memory 20 for the redundant cells, with one writing access, is very effective in elevating the throughput of the test for the semiconductor memory, which is remarkably elevated at present.

When the fail information is read out from the fail information memory 20 for the redundant cells, if the read-out fail information bit is at a high level, the address of the read-out fail information bit of the high level is decoded. By decoding the "0"th bit to the "3"rd bit of the address, it is possible to know which of the comparator channels was the "fail".

Now, an example of the reading of the fail information memory 20 for the redundant cells in the embodiment of the present invention will be described with a flow chart of FIG. 9.

For example, the reading of the fail information memory 20 starts from the address "0" in the fail information memory 20 (step S1)

Whether or not the read-out data shows the "fail" (high level) is discriminated (step S2). When the read-out data shows the "fail", the process goes to a step S3. If the "0"th bit (D0) of the reading address is "0", the channel "0" is the "fail". More specifically, in the channel "0", the redundant cell designated by the reading address excluding the four least significant bits of the address (corresponding to the channel data bits D0 to D3) is the "fail". If the "b1"th bit (D1) of the reading address is "0", the channel "1" is the "fail". If the "2"th bit (D2) of the reading address is "0", the channel "2" is the "fail". If the "3"th bit (D3) of the reading address is "0", the channel "3" is the "fail". Then, the process goes to a step S4. On the other hand, when the read-out data shows the "pass" (low level) in the step S2, the process goes directly to the step S4.

In the step S4, the address is incremented by one, and then, in a step S5, whether or not the incremented address is a final address is discriminated. If the incremented address is the final address, the process ends. On the other hand, if the incremented address is not the final address, the process returns to the step S1.

Incidentally, a plurality of output bits (for example, 4 bits, 8 bits, etc.) of the semiconductor memory of the device under test can be compared with the expected value pattern by a corresponding number of digital comparators, or alternatively, respective one-bit outputs of a plurality of semiconductor memories simultaneously tested by the memory tester can be supplied to a corresponding number of digital comparators.

In addition, the embodiment described above with reference to the drawings is shown only for making it easier to understand the present invention, and therefore, it should be noted that the present invention is in no way limited to the details of the illustrated structures but changes and modifications may be made within the scope of the appended claims. For example, it is a matter of course that the number of the comparator channels is in no way limited to four channels "0" to "3" in the above mentioned embodiment. In addition, it is also a matter of course that the method for generating the X address for the fail information memory for the redundant cells is not limited to the example shown in FIG. 7. Furthermore, the fail information bit of the high level is written into the fail information memory in the above mentioned embodiment, but the fail information bit of the low level can be written into the fail information memory.

As seen from the above, a first advantage of the present invention is that it is possible to remarkably reduce the required memory capacity of fail information memory for the test of the redundant cells, in comparison with the fail information memory in the imaginary prior art example shown in FIG. 4.

The reason for this is that, according to the present invention, only one fail information memory for the redundant cells is provided for a plurality of fail information memories for the main cell array, and the fail information of the redundant cells of the device under test is written into the only one fail information memory for the redundant cells.

A second advantage of the present invention is that it is possible to shorten the writing time of the fail information of a plurality of comparator channels, while reducing the required memory capacity of the fail information memory for the test of the redundant cells.

The reason for this is that, according to the present invention, when at least one of a plurality of comparator channels outputs the comparison result indicative of the "fail", the fail information is written into the fail information memory at the address synthesized from the respective comparison results outputted from the plurality of comparator channels and the address signal when the "fail" occurs. Accordingly, the fail information represented by a plurality of bits corresponding to the plurality of comparator channels is written into one cell in the fail information memory for the redundant cells, with one writing access.

What is claimed is:

1. A memory testing apparatus for testing a semiconductor memory, comprising:
    means receiving respective comparison results outputted from a plurality of comparators, each of which compares an output signal outputted from a semiconductor memory under test with an expected value, and an address supplied to said semiconductor memory under test, and for synthesizing an address for a fail information memory; and
    means for writing fail information into said fail information memory at said address synthesized, when at least one of said comparison results outputted from said plurality of comparators indicates a "fail",
    whereby a corresponding number of fail information outputted from said plurality of comparators is written into one cell within said fail information memory.

2. A memory testing apparatus for testing a semiconductor memory, comprising:
    a plurality of main cell fail information memories for a main cell array in a semiconductor memory under test, said plurality of fail information memories being provided for a corresponding number of comparator channels, respectively; and
    one redundant cell fail information memory provided for redundant cells in said semiconductor memory under test, one for said plurality of main cell fail information memories, so that a test result of said redundant cells in said semiconductor memory under test is written into said redundant cell fail information memory.

3. A memory testing apparatus claimed in claim 2, further including:
    address synthesizing means receiving respective comparison results outputted in parallel from a plurality of comparators, each of which compares an output signal outputted from a semiconductor memory under test with an expected value, and an address supplied to said semiconductor memory under test, and for synthesizing a redundant cell fail information memory address for said redundant cell fail information memory, when said redundant cells in said semiconductor memory under test are tested; and
    control means for writing fail information into said redundant cell fail information memory at said redundant cell fail information memory address thus synthesized, when at least one of said comparison results outputted in parallel from said plurality of comparators indicates a "fail",
    whereby, when said redundant cells in said semiconductor memory under test are tested, the fail information is written into said redundant cell fail information memory at said redundant cell fail information memory address thus synthesized, with the result that fail information represented by a plurality of fail information bits outputted from said plurality of comparators is written into one cell within said fail information memory with one writing access.

4. A memory testing apparatus claimed in claim 3, wherein said control means includes a logic circuit receiving said respective comparison results outputted in parallel from said plurality of comparators, for generating a signal activating said redundant cell fail information memory when the at least one of said comparison results outputted in parallel from said plurality of comparators indicates the "fail".

5. A memory testing apparatus claimed in claim 4, wherein said address synthesizing means synthesizes said redundant cell fail information memory address having a first predetermined bit field filled with address bits extracted from said address supplied to said semiconductor memory under test and a second predetermined bit field filled with said respective comparison results outputted in parallel from said plurality of comparators.

6. A memory testing apparatus claimed in claim 5, further including a circuit receiving a control signal which is activated when said redundant cells in said semiconductor memory under test are tested, said circuit inactivating said main cell fail information memories and activating said redundant cell fail information memory when said redundant cells in said semiconductor memory under test are tested, and said circuit activating said main cell fail information memories and inactivating said redundant cell fail information memory when said main cell array in said semiconductor memory under test is tested.

7. A memory testing apparatus claimed in claim 6, further including a discriminating means receiving a reading address supplied to said redundant cell fail information memory and data read out from said redundant cell fail information memory when said fail information is read out from said redundant cell fail information memory, said discriminating means discriminating in such a manner that when said data read out from said redundant cell fail information memory indicates the "fail", if one bit of bits corresponding to said respective comparison results outputted in parallel from said plurality of comparators, in a predetermined bit field of said reading address supplied to said redundant cell fail information memory, takes a first logic level, the comparison result of the comparator corresponding to said one bit taking said first logic level is the "fail", and if one bit of bits corresponding to said respective comparison results outputted in parallel from said plurality of comparators, in said predetermined bit field of said reading address supplied to said redundant cell fail information memory, takes a second logic level, the comparison result of the comparator corresponding to said one bit taking said second logic level is a "pass".

8. A memory testing apparatus claimed in claim 3, wherein said address synthesizing means synthesizes said redundant cell fail information memory address having a first predetermined bit field filled with address bits extracted from said address supplied to said semiconductor memory under test and a second predetermined bit field filled with said respective comparison results outputted in parallel from said plurality of comparators.

9. A memory testing apparatus claimed in claim 8, further including a circuit receiving a control signal which is activated when said redundant cells in said semiconductor memory under test are tested, said circuit inactivating said main cell fail information memories and activating said redundant cell fail information memory when said redundant cells in said semiconductor memory under test are tested, and said circuit activating said main cell fail information memories and inactivating said redundant cell fail information memory when said main cell array in said semiconductor memory under test is tested.

10. A memory testing apparatus claimed in claim 3, further including a circuit receiving a control signal which is activated when said redundant cells in said semiconductor memory under test are tested, said circuit inactivating said main cell fail information memories and activating said redundant cell fail information memory when said redundant cells in said semiconductor memory under test are tested, and said circuit activating said main cell fail information memories and inactivating said redundant cell fail information memory when said main cell array in said semiconductor memory under test is tested.

11. A memory testing apparatus claimed in claim 3, further including a discriminating means receiving a reading address supplied to said redundant cell fail information memory and data read out from said redundant cell fail information memory when said fail information is read out from said redundant cell fail information memory, said discriminating means discriminating in such a manner that when said data read out from said redundant cell fail information memory indicates the "fail", if one bit of bits corresponding to said respective comparison results outputted in parallel from said plurality of comparators, in a predetermined bit field of said reading address supplied to said redundant cell fail information memory, takes a first logic level, the comparison result of the comparator corresponding to said one bit taking said first logic level is the "fail", and if one bit of bits corresponding to said respective comparison results outputted in parallel from said plurality of comparators, in said predetermined bit field of said reading address supplied to said redundant cell fail information memory, takes a second logic level, the comparison result of the comparator corresponding to said one bit taking said second logic level is a "pass".

12. A memory testing apparatus for testing a semiconductor memory, comprising:
   a plurality of main cell fail information memories for a main cell array in a semiconductor memory under test, said plurality of fail information memories being provided for a corresponding number of comparator channels, respectively, so that when a comparison result obtained by comparing data read out from said main cell array in said semiconductor memory under test, with an expected value by means of a comparator, indicates a "fail", fail information is written into the main cell fail information memory at an address corresponding to an address at which said data is read out from said main cell array; and
   one redundant cell fail information memory provided for redundant cells in said semiconductor memory under test, one for said plurality of main cell fail information memories, so that a test result of said redundant cells in said semiconductor memory under test is written into said redundant cell fail information memory,
   wherein, when said redundant cells in said semiconductor memory under test are tested, if a redundant cell tested is a "fail", fail information is written into said redundant cell fail information memory at an address generated on the basis of a reading address supplied to said redundant cells when the "fail" occurs, and respective comparison results outputted in parallel from said comparator channels.

13. A memory testing method for testing a semiconductor memory having redundant cells in addition to a main cell array, as a device under test, by use of a memory testing apparatus,
   the memory testing apparatus comprising:
      a plurality of main cell fail information memories for said main cell array in the semiconductor memory under test, said plurality of fail information memories being provided for a corresponding number of comparator channels, respectively; and
      one redundant cell fail information memory provided for said redundant cells in said semiconductor memory under test, one for said plurality of main cell fail information memories, so that a test result of said redundant cells in said semiconductor memory,
   wherein, when at least one of respective comparison results outputted from a plurality of comparators, each of which compares an output signal outputted from said semiconductor memory under test with an expected value, indicates a "fail", an address is synthesized from said respective comparison results outputted in parallel from said plurality of comparator and an address supplied to said semiconductor memory under test when the "fail" occurs, and fail information is written into said redundant cell fail information memory at said address thus synthesized, so that fail information represented by a plurality of fail information bits outputted in parallel from said plurality of comparators is written into one cell within said fail information memory with one writing access.

14. A memory testing method claimed in claim 13, wherein when said data read out from said redundant cell fail information memory indicates the "fail", a predetermined bit field of a reading address supplied to said redundant cell fail information memory is checked, and if one bit of bits corresponding to said respective comparison results outputted in parallel from said plurality of comparators, in said predetermined bit field of said reading address, takes a first logic level, it is discriminated that the comparison result of the comparator corresponding to said one bit taking said first logic level is the "fail", and if one bit of bits corresponding to said respective comparison results outputted in parallel from said plurality of comparators, in said predetermined bit field of said reading address, takes a second logic level, it is discriminated that the comparison result of the comparator corresponding to said one bit taking said second logic level is a "pass".

* * * * *